United States Patent [19]

Lipka et al.

[11] 4,424,097
[45] Jan. 3, 1984

[54] METAL STRIPPING PROCESS AND COMPOSITION

[75] Inventors: Erich Lipka, Eching; Eberhard Lendle, Oberasbach, both of Fed. Rep. of Germany

[73] Assignee: Elget Ing.-Büro für Grafische und Elektronische Technik, Oberasbach, Fed. Rep. of Germany

[21] Appl. No.: 406,311

[22] Filed: Aug. 9, 1982

[30] Foreign Application Priority Data

Aug. 17, 1981 [DE] Fed. Rep. of Germany ....... 3132427
Mar. 6, 1982 [DE] Fed. Rep. of Germany ....... 3208124

[51] Int. Cl.$^3$ ............................. C23F 1/02; B44C 1/22
[52] U.S. Cl. ........................................ 156/656; 134/3; 156/664; 252/79.2; 252/79.4
[58] Field of Search ...................... 134/3, 41; 156/656, 156/664; 252/79.2, 79.4, 142

[56] References Cited

U.S. PATENT DOCUMENTS 4,260,451 4/1981 Schmeckenbecher .......... 156/656 X

FOREIGN PATENT DOCUMENTS 51-45625 4/1976 Japan ................................. 252/79.2

*Primary Examiner*—William A. Powell
*Attorney, Agent, or Firm*—Toren, McGeady and Stanger

[57] ABSTRACT

A stripper, for the removal of tin and tin compounds, in particular copper metal-resists in contact switches, comprises an aqueous solution of 5 to 20% v/v hydrochloric acid, 2.5 to 6.0 g/l copper and 9 to 40 g/l tin, as well as, at the beginning of the stripping process, up to 0.5 ml/l hydrogen peroxide or up to 0.015 ml/l of a surfactant.

8 Claims, No Drawings

METAL STRIPPING PROCESS AND COMPOSITION

The invention relates to a stripper for the removal of tin and tin alloys, especially of copper in metalresists, in particular for contact switches.

In the preparation of through-metallised contact switches, the copper conductive pattern and through-holes of the base plate are conventionally galvanically plated in high-lustre tin- or lead-, tin-alloy baths with about 60% tin and 40% lead, in order to provide a corrosion-resistant metal layer. In this process, a tin or alloy layer of 6 to 12µ is deposited on the copper conductive pattern. This process provides high tarnish- and corrosion-resistance, with good solderability and substantial freedom from pores. The tin layer also serves to resist corrosion on removal of the copper base layer with selective caustic alkalis.

According to their application, however, pure tin layers exhibit the danger of "whisker" formation or, in addition, tin plague. Accordingly, in many places, tin-lead coatings are preferred, although their solderability deteriorates sharply after long storage. In order to increase the storage stability and to maintain the solderability, alloy layers have been submitted to a post-smelting process in an oil bath or infra-red oven, after the copper conductive layer has been etched away.

The circuit boards are then provided, on one or both sides, with a solder-preventive mask. As a result, only the solder points remain open and the circuit board is protected from the heat of soldering.

If circuit boards which have been treated in the described manner are provided with elements which are then soldered in the contact holes, the so-called "crinkle effect" is often observed. This crinkle effect is caused, on soldering, because the tin under the solder-preventive mask is melted on account of its low melting point and creases the painted-on layer following volume increase or change. In order to avoid this disadvantage, hot air-levelling is used more and more in practice, in which the solder-preventive mask is applied directly onto the conductive pattern of weakly-oxidised copper or deoxidised pure copper. The drilled circuit board is through-contacted in a galvanic copper bath and then etched using an acidic or alkaline medium, to obtain the conductive pattern with its solder points and through-holes. The solder-preventive lac is then applied and a eutectic solder applied in the solder points, without causing the crinkle effect.

Various processes are known for the preparation of copper through-contact circuit boards, from which the above-described production of the conductive layer, using a metal-resist in the course of tinning and the subsequent tin removal, has usually proved good. In such a method, the conductive configuration is applied photographically onto the coppered circuit board using a galvano-resist in the sieve-pressure process or a solid or fluid-resist, together with a lustrous or matt tin layer, and the metal-resist at the solder points and in the holes is simultaneously brought to a thickness of 2 to 4µ, in order to protect the contact lines and through-holes satisfactorily, on alkaline etching.

The application of the tin as a metallic etch-resist in the preparation of hot-tinned circuit boards is advantageous, but for the subsequent removal of the tin or tin alloy layer, special strippers are necessary, which do not attack the copper of the conductive pattern too strongly. Acidic media are usually used in known tin stripping processes, and in general acids such as fluoboric acid or nitric acid are used. These acids, however, are very strong and therefore attack metals such as aluminium, steel, refined steel and even titanium. In consequence, such strippers can only be used where members used in stirring, such as pumps, conveying equipment, pipes and valves are made of plastics or, as far as possible, covered with plastics. Known metal removal apparatus cannot be used in the process, and this involves additional expense.

Sulphuric acid strippers require, in addition, a bath temperature of 80° to 90° C., and special heating apparatus comprising lead hose, graphite pipes or porcelain. A further disadvantage is the high toxicity of known strippers, which requires special protective measures and careful preparation or detoxification and neutralisation of the spent solutions. This can be achieved, for example, with calcium sulphate and caustic soda solutions, but the lead and tin slurries which are removed must be filtered and disposed of in special deposition apparatus. The filtrate must then be brought to a pH value of about 8 with dilute sulphuric acid, and diluted with a large amount of water.

Other acidic or alkaline tin strippers are known; these are not suitable for the removal of metals from circuit boards, on account of the high bath temperatures which are necessary, or their reactivity with respect to metals.

An object of the present invention is to provide a stripper which does not require special equipment, is economical, and requires no waste water treatment, as well as allowing the simple recovery of stripped metal. A solution for this purpose comprises a aqueous solution with 5 to 20, preferably 10, % v/v hydrochloric acid and 2.5 to 6.0, preferably 3.5 to 4, g/l copper.

A stripper of the invention, comprising hydrochloric acid and containing copper, allows the use of conventional washing, spraying and sump equipment, for example, conventional spraying and washing apparatus with flat, circular or square jets or stationary nozzles. Such commercially-available apparatus can be equipped simply or linked to a particular stripper line, without special measures being necessary, because the materials used are sufficiently resistant to hydrochloric acid in the presence of low amounts of copper and tin or tin alloy. It is a great advantage that the stripper of the invention is of low toxicity, and does not require any particular protective measures to be taken.

A further advantage follows, in that the stripper of the invention dissolves copper/tin or tin alloys in the region of the boundary surface, and in particular the inter-metallic copper-tin compounds formed on tinning. Such inter-metallic compounds form during long storage of tinned circuit boards, and cannot be removed with conventional fluorboric or nitric acid strippers.

The presence of 2.5 to 6.0 g/l copper in 5 to 20% v/v hydrochloric acid allows problem-free stripping of the shiny and matt tin layers, without affecting the sensitive conductive pattern beneath. The copper (II) chloride contained in the stripper is reduced, during stripping, to copper (I) chloride, and must subsequently be re-oxidised. This occurs initially, i.e. at the beginning of the stripping process, by means of an addition of 0.5 ml/l hydrogen peroxide, whose released oxygen atom re-oxidises the copper (I) chloride, so that the solution is substantially free of copper (I) chloride ion content. When the hydrogen perioxide is spent, then the stripper is enriched with atmospheric oxygen during the spraying of the circuit board, to an extent that the formation of copper (I) chloride in this manner is suppressed.

Instead of hydrogen peroxide, up to 0.015 ml/l of a surfactant or wetting agent, preferably acid-containing, can be included in the stripper at the beginning of the stripping process. The wetting agent may, for example, be based on alkyl polyglycol ethers, fatty acid polyglycol ethers, alkoxylates, perfluorocarboxylic acids or perfluorosulfonic acids. In the given concentration, surfactants have, on account of their good solubility in water and their surface activity, proved outstandingly good; they preferably contain acid.

If the copper content of the stripper bath exceeds 6.0 g/l, atmospheric oxygen is insufficient, and the solution becomes unstable unless copper (II) chloride can be added. With such an addition, there is rather an undesirable attack on the copper of the conductive pattern. In order to maintan the workability of the stripper, only the hydrochloric acid and copper concentrations should be kept constant. This can be achieved by continuous addition of hydrochloric acid, using conventional metering apparatus, as well as by metal removal, using a galvanic metal recovery cell which keeps the tin content of the bath constant, preferably at 9 to 40, e.g. 10 to 12, g/l. The metal recovery cell can be provided in a by-pass, in order that the de-tinned solution can be returned into the bath. Alternatively, the de-tinned solution can however by worked-up using a conventional ion-exchanger or current neutralisation, and then passed into the canalisation.

Since the copper is not used up, there is only a very small increase of the copper concentration, owing to minimal dissolution of the copper of the conductive pattern, which cannot be avoided. The resultant increase of the copper concentration counteracts, however, the subsequent addition of hydrochloric acid. By contrast, the copper content of the bath can also be kept constant, at the desired value of 2.5 to 6.0 g/l, using a metal recovery cell.

Metering apparatus, or pumps, for the dosing-in of hydrochloric acid, can be controlled in conventional manner in dependence on the board through-put, for example using a light meter. Simultaneously, the concentration of tin and copper in the stripper bath can be observed and controlled colorimetrically or using redox potentials.

The necessary hydrochloric acid is advantageously added in an amount of 10 to 12 l/h per 100 liter tank capacity of the stripper solution. The copper content of the stripper remains essentially constant, since copper decomposition is balanced by a corresponding copper uptake during etching of the tin alloy. As a result, the copper loss caused by the displacement from the treatment tank of an amount of stripper corresponding to added hydrochloric acid, is also compensated.

The invention is illustrated by the following two Examples.

EXAMPLE 1

941.5 g copper (II) chloride were dissolved in about 70 l water. 13 l concentrated hydrochloric acid and 2.28 g tin (II) chloride were added to the solution. The solution was then diluted with water to 100 l, to give a stripper solution according to the invention. 1.5 ml of a surfactant was added. Finally, the solution was used at room temperature for 15 minutes in stripper apparatus, to remove a tin alloy of 60% tin and 40% lead from a copper circuit board. Analysis of the stripper showed 3.5 g/l copper, 12 g/l tin and 130 ml/l HCl. The rate of separation was 4 to 5 $\mu$/min at a through-put of 0.6 m/min.

EXAMPLE 2

Again, 941.5 g copper (II) chloride were dissolved in about 70 l water and 13 l concentrated hydrochloric acid added to the solution. This basic solution was then introduced into the tank of stripper apparatus having 1.2 kg pure tin anodes in the spraying area, in order to set the desired tin content of the stripper, without using a soluble tin salt. After about 2 hours' spraying, the tin was completely dissolved, and the solution was diluted to 100 l with water. Analysis of the stripper showed 3.5 g/l copper, 12 g/l tin and 130 ml/l hydrochloric acid. After the addition of 1.5 ml of a surfactant, the stripper was ready for use; it was used in the same stripper apparatus for the stripping of tin and exhibited, in continuous trials, a dissolution rate of 4 to 5 $\mu$/min at a through-put of 0.6 m/min.

We claim:

1. A process for the removal of tin and tin alloys, which comprises applying an aqueous solution containing 5 to 20% v/v hydrochloric acid and 2.5 to 6.0 g/l copper.

2. The process of claim 1, for the removal of copper metal-resists.

3. The process of claim 1, in which up to 0.5 ml/l hydrogen peroxide is initially added to the solution.

4. The process of claim 1, in which up to 0.015 ml/l of a surfactant is added initially to the solution.

5. The process of claim 1, in which the tin content of the solution is maintained constant at 9 to 40 g/l.

6. The process of claim 1, in which the tin and copper contents of the solution are controlled to a constant level, colorimetrically or using redox potentials.

7. The process of claim 1, in which metals are removed from the solution using a metal recovery cell.

8. The process of claim 1, in which hydrochloric acid is added continuously to the solution.

* * * * *